(12) United States Patent
Weng et al.

(10) Patent No.: US 8,193,824 B2
(45) Date of Patent: Jun. 5, 2012

(54) MONITORING PLASMA INDUCED DAMAGE DURING SEMICONDUCTOR WAFER PROCESSES

(75) Inventors: Wu-Der Weng, Hsinchu (TW); Ji-Shyang Nieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 421 days.

(21) Appl. No.: 12/433,488

(22) Filed: Apr. 30, 2009

(65) Prior Publication Data

US 2009/0281745 A1 Nov. 12, 2009

Related U.S. Application Data

(60) Provisional application No. 61/051,518, filed on May 8, 2008.

(51) Int. Cl.
*G01R 31/00* (2006.01)
*G01R 31/26* (2006.01)

(52) U.S. Cl. .......... 324/750.01; 324/760.01; 324/762.01

(58) Field of Classification Search .......... 324/762.01–762.09, 760.01–760.02, 324/754.01–754.3; 438/381, 14–18; 257/208, 257/209, 48
See application file for complete search history.

(56) References Cited

U.S. PATENT DOCUMENTS 5,754,418 A * 5/1998 Park et al. ........................ 363/60
6,016,062 A * 1/2000 Nicollian et al. ......... 324/754.21

OTHER PUBLICATIONS

Cheung, Kim P., "Advanced plasma and advanced gate dielectric—a charging damage prospective", 44th Annual Int'l Reliability Physics Symposium, San Jose, 2006, pp. 360-364.
CN Office Action 200810167686.8 issued May 14, 2010.

* cited by examiner

*Primary Examiner* — Jermele M Hollington
*Assistant Examiner* — Tung X Nguyen
(74) *Attorney, Agent, or Firm* — K&L Gates LLP

(57) ABSTRACT

A plasma damage detection test structure is disclosed. The plasma damage detection test structure includes a first antenna, a voltage source, a ground reference, a first transistor comprising a first source, a first gate, and a first drain. The plasma damage detection test structure further includes a second transistor comprising a second source, a second gate, and a second drain. The first gate is conductively coupled to said first antenna, said first drain and said second drain are conductively coupled to said voltage source, and said first source and said second source are conductively coupled to said ground reference. In various embodiments multiple antennas may be used. The antennas may be multiple configurations, such as a symmetric arrangement or asymmetric arrangement. In various embodiments, multiple transistors in parallel or cross-couple arrangements may be used.

19 Claims, 9 Drawing Sheets

MONITORING PLASMA INDUCED DAMAGE DURING SEMICONDUCTOR WAFER PROCESSES

CROSS REFERENCE

This application claims the benefits of U.S. Provisional Patent Application Ser. No. 61/051,518, which was filed on May 8, 2008, and entitled "MONITORING PLASMA INDUCED DAMAGE DURING SEMICONDUCTOR WAFER PROCESSES."

BACKGROUND

The manufacture of large scale integrated circuits in a mass production facility involves hundreds of discrete processing steps beginning with the introduction of blank semiconductor wafers at one end and recovering the completed chips at the other. The manufacturing process is usually conceived as consisting of the segment wherein the semiconductor devices are formed within the silicon surface and the portion which includes the formation of the various layers of interconnection metallurgy above the silicon surface. Most of these processing steps involve depositing layers of material, patterning them by photolithographic techniques, and etching away the unwanted portions. The materials consist primarily of insulators and metal alloys. In some instances the patterned layers serve as temporary protective masks. In others they are the functional components of the integrated circuit chip.

Radio-frequency (RF) plasmas may be used extensively in many of these processing steps. Reactive-ion-etching (RIE) provides the etching anisotropy required to achieve a high degree of pattern definition and precise dimensional control. Here the gaseous chemical etching is assisted by unidirectional ion bombardment provided by an RF plasma. Plasma etching, which is accomplished at higher pressures, is isotropic. Photoresist layers too, are frequently removed, not by chemical solvents, but more cleanly by plasma ashing.

A metal-oxide-silicon-field-effect-transistor (MOSFET) is a device consisting of two shallow regions of one type semiconductor—the source and the drain—separated by a region of another type. The conductivity of the central region (channel) is modulated by applying a voltage to an electrode (gate) which overlies the channel region and is separated from it by a thin insulating layer (gate oxide). CMOS (complementary MOS) technology utilizes MOSFETS in pairs, one an n-type channel device (NMOS) and the other a p-type channel device (PMOS). The simple nature of these devices and their minimal heat dissipation permits an extraordinary degree of miniaturization and consequently a high density of circuits.

The gate insulating layer which overlies the channel region usually consists of thermally grown silicon oxide and is one of the most critical components of the MOSFET. The insulating film is highly susceptible to damage from external sources during manufacture. A prominent cause of such damage is ion and electron bombardment from plasmas used while forming the various layers. The surfaces of patterned semiconductor wafers located within a plasma reactor present multiple areas of conductors and insulators to the plasma. These produce local non-uniformities in the plasma currents which result in charge build-up on the electrically floating conductor surfaces.

After the gate oxide layer is formed it is covered with a layer of polysilicon within which the gate electrode is defined. The etching of this polysilicon layer may be accomplished by reactive-ion-etching, providing the first in a series of exposures of the gate oxide to an RF plasma. In this instance, the area of the gate electrode is covered with photoresist. As etching proceeds, the exposed polysilicon provides sufficient conduction to prevent local charge build-up. However, as the endpoint is approached, the polysilicon layer breaks up and residual, now isolated, regions of polysilicon surrounding the photoresist protected gate electrode act as an antenna which accumulate positive charge. This results in the development of a positive potential sufficiently high to cause current flow through the gate oxide. These polysilicon halos can present a high antenna-to-thin oxide area ratio causing massive current flow in the oxide. As etching proceeds, the halos of polysilicon disappear and the antenna area is reduced to the thin edges of the gate electrode itself.

The mechanism of current flow though the gate oxide is primarily Fowler-Nordheim (FN) tunneling. FN tunneling occurs at fields in excess of 10 MV/cm. Charge build up on the gate electrode resulting in a gate electrode potential of only 10 volts is therefore sufficient to induce FN tunneling through an oxide layer of 100 Angstroms. Such potentials are easily achieved in conventional plasma reactors. Excessive FN tunneling currents eventually lead to positively charged interface traps in the oxide and subsequent dielectric breakdown.

A consequence of these numerous exposures of semiconductor wafers to RF plasmas and other forms of ionic radiation, is the potential occurrence of radiation damage and the accumulation of charge on exposed conductive components which leads to damaging current flows and trapped charge affecting the semiconductor devices. Thus, plasma induced damage is a well-known issue during the semiconductor wafer manufacturing process. Sometime referred to as the "antenna effect" or "plasma induced gate oxide damage", plasma induced damage typically refers to the charge accumulation in isolated nodes during the processing of an integrated circuit. Such damage may affect the reliability and performance of the integrated circuit device.

Therefore there is a need for improved methods and devices for detecting plasma induced damage occurring semiconductor processing.

FIGURES

Embodiments of the present invention are described herein, by way of example, in conjunction with the following figures, wherein.

DESCRIPTION

Figure 1:
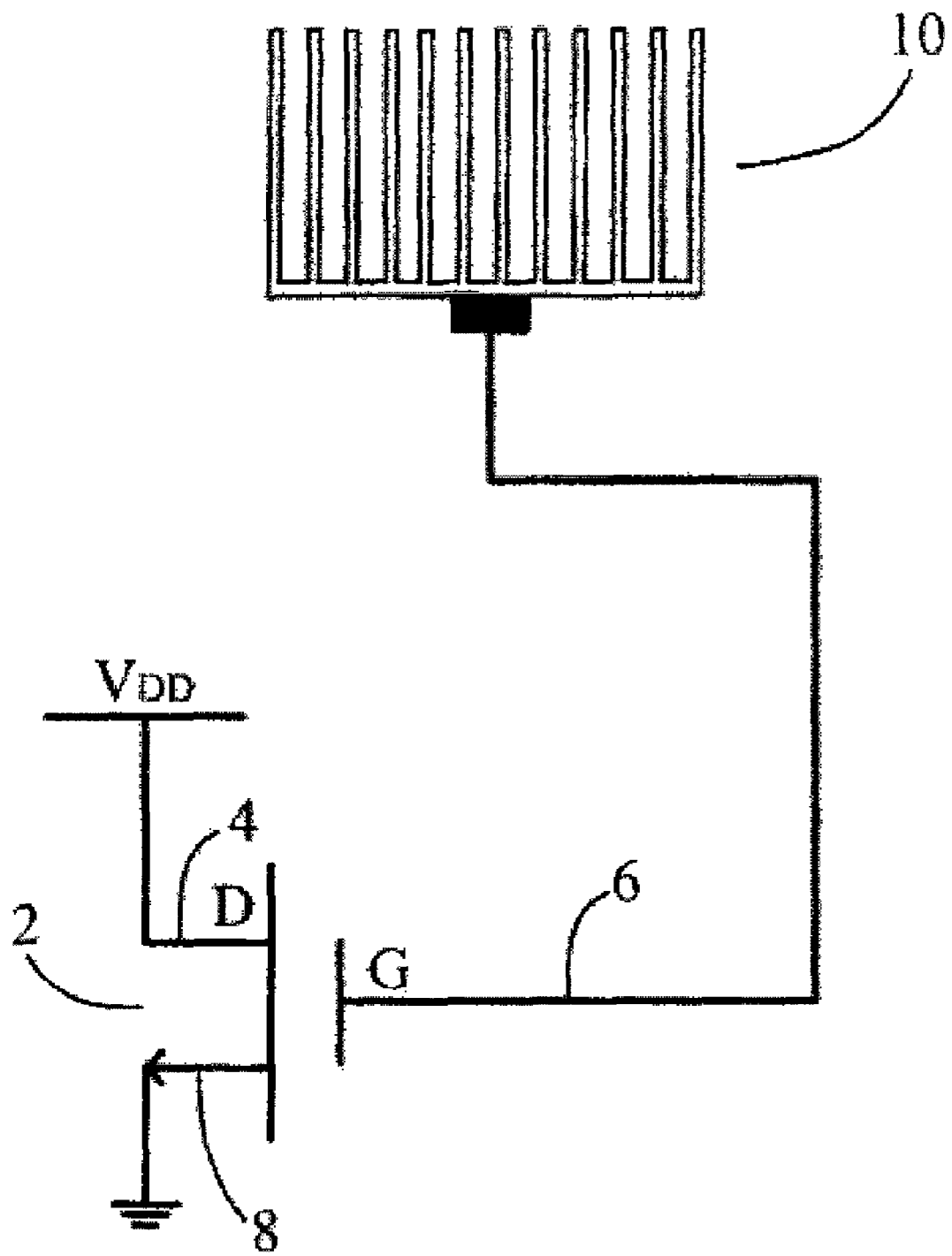
FIG. 1 illustrates a prior art plasma induced damage tester.

The various embodiments are directed to test structures and measurement methods to monitor plasma induced damage of silicon wafers. Generally, the embodiments have a higher damage sensitivity, as compared to other known methods, and allow for estimation of circuit level impact. One known technique of detecting plasma induced damage utilizes a Metal Oxide Semiconductor (MOS) capacitor or a single transistor connected to an antenna to monitor the charging effect. Generally, an "antenna" is a conductor exposed to plasma during the wafer process, such as a metal layer or a Polycrystalline silicon (Poly-Si) layer during a plasma etching process. FIG. 1 illustrates a known plasma induced damage monitoring technique. As shown, a single MOS transistor 2, with a drain 4, a gate 6, and a source 8 is used. Gate 6 is conductively coupled to an antenna 10. This prior art technique has limited sensitivity and it may be difficult to estimate the impact of the damage at a circuit level. Further, this technique usually only monitors certain parameters or characteristics, such as gate oxide integrity degrading (Lg tailing), device parameters (Vt, Gm shift), and reliability parameters (NBTI, HCI).

In various embodiments, as discussed in more detail below, the presently disclosed testing structure may use matching structures with parallel type or cross-couple type transistor structures to monitor device damage. Also, the testing structure may use a symmetric antenna structure to monitor local plasma uniformity and an asymmetric antenna structure to monitor non-balance antenna design. In various embodiments numerous electrical and reliability parameters can be characterized, including: gate oxide integrity (Vbd), device (Delta Vt, Delta Gm, Delta Idsat), matching (STDEV(Delta Idsat), STDEV(Delta Vt)), and reliability (NBTI, HCI). Additionally, the testing structure is formed in the silicon wafer may closely approximate a real circuit on the chip, such as an amplifier.

Figure 2:
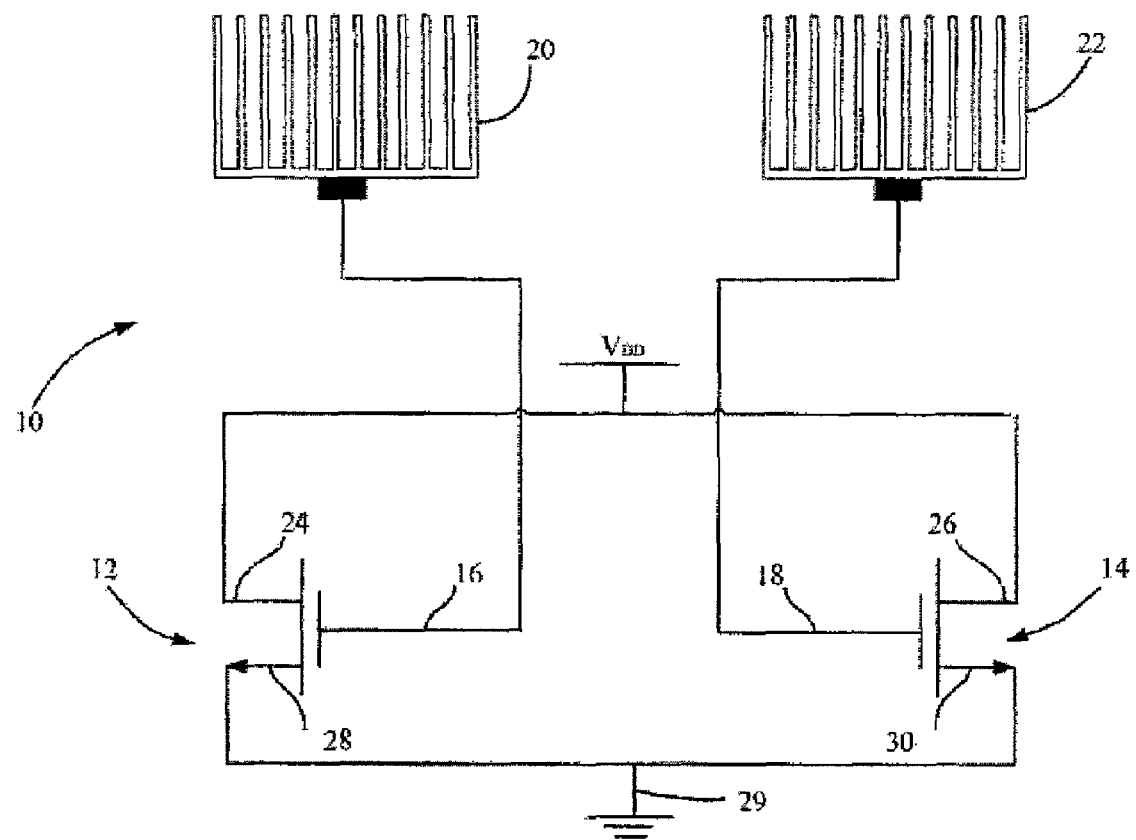
FIG. 2 illustrates a circuit diagram of a plasma induced damage tester with a "parallel" transistor structure and "symmetric" antenna structure in accordance with an embodiment of the present invention.

As shown in FIG. 2, a tester 10 with a "parallel" type transistor structure is shown. A transistor 12 and a transistor 14 are configured such that their respective gates, 16, 18 may be conductively coupled to antenna structures 20, 22, respectively. In various embodiments, transistors 12, 14 may be MOS transistors. Antenna structures 20, 22 in this embodiment are symmetric. Drain 24 of transistor 12 and drain 26 of transistor 14 may be conductively coupled together and conductively coupled to a voltage source (shown as VDD). As indicated, source 28 of transistor 12 and source 30 of transistor 14 may be conductively coupled together and conductively coupled to a ground reference 29 (shown as VSS).

Figure 3:
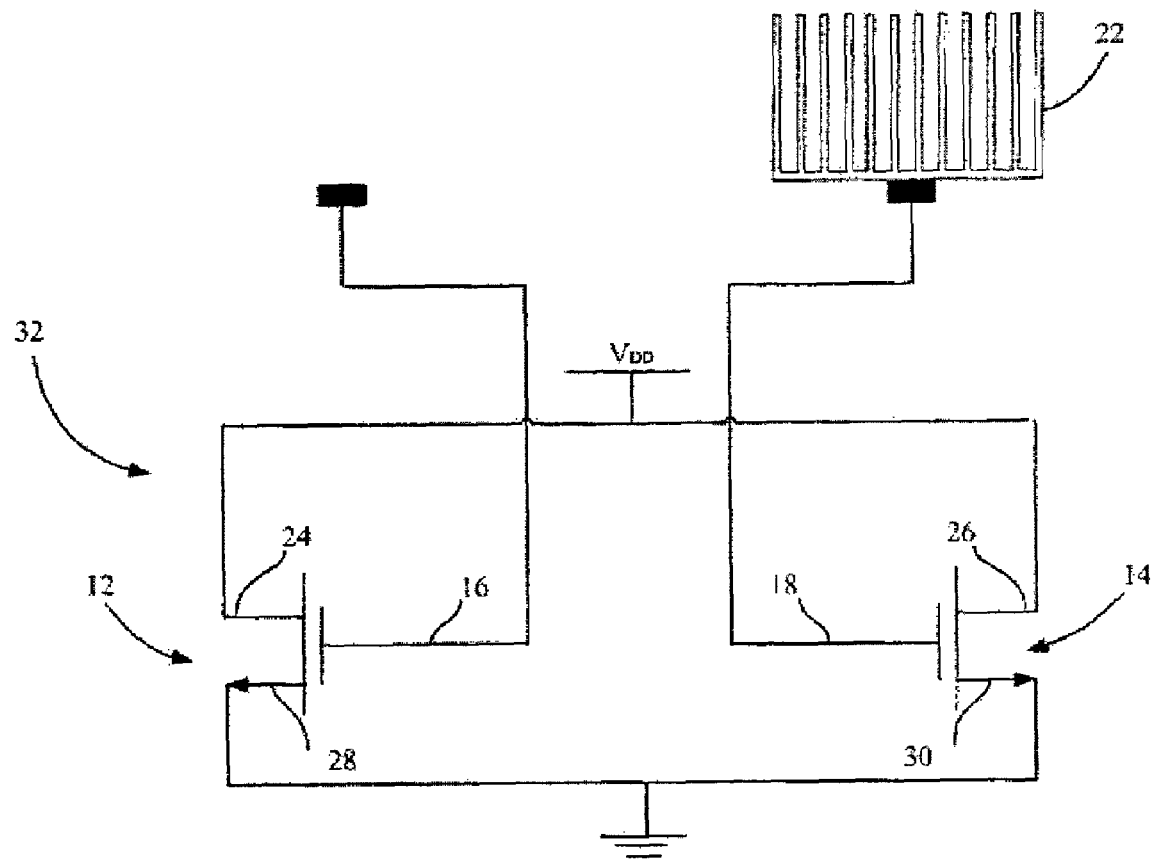
FIG. 3 illustrates a circuit diagram of a plasma induced damage tester with a "parallel" transistor structure and "asymmetric" antenna structure in accordance with an embodiment of the present invention.

Referring now to FIG. 3, a tester 32 with a "parallel" type transistor structure is shown. Similar to FIG. 1, drain 24 of transistor 12 and drain 26 of transistor 14 may be conductively coupled together and conductively coupled to a voltage source (shown as VDD). As indicated, source 28 of transistor 12 and source 30 of transistor 14 may be conductively coupled together and conductively coupled to a ground reference 29. In this embodiment, an asymmetric antenna structure is utilized and only one gate of a transistor is conductively coupled to antenna 22. As shown, in this embodiment gate 18 of transistor is conductively coupled to antenna 22, although it will be appreciated by those skilled in the art that other gates and other antennas may be utilized as well.

Figure 4:
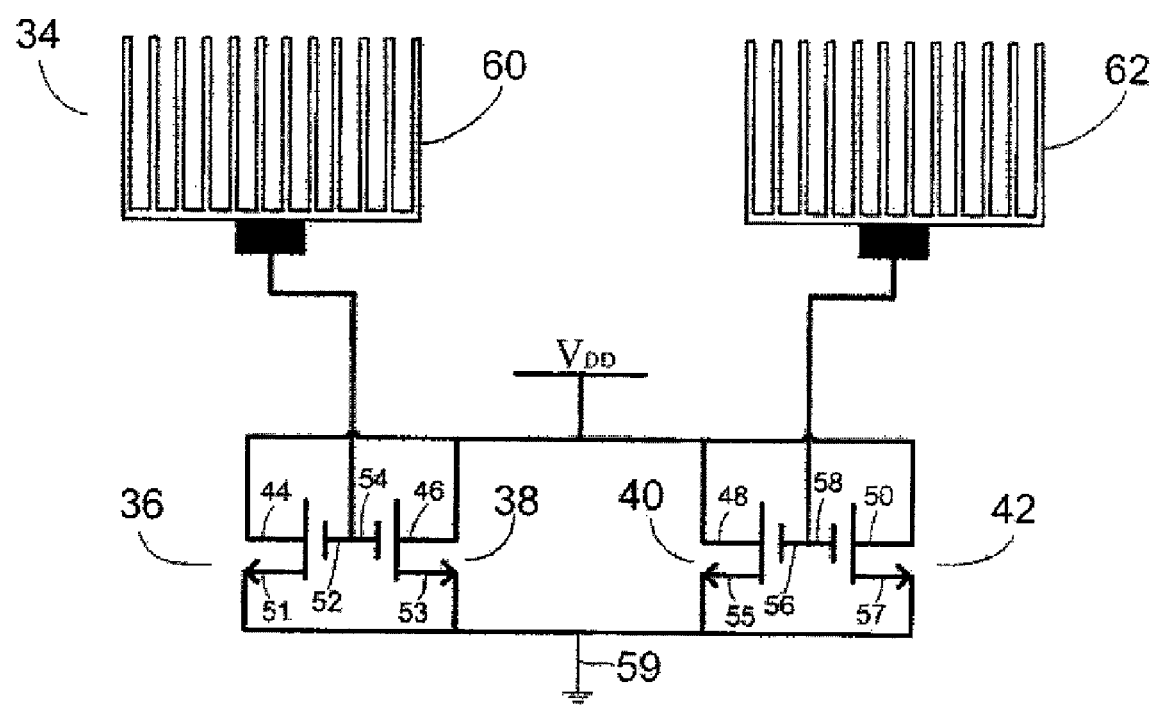
FIG. 4 illustrates a circuit diagram of a plasma induced damage tester with a "cross-couple" type transistor structure and "symmetric" antenna structure in accordance with an embodiment of the present invention.

Referring now to FIG. 4, a tester 34 with a "cross-couple" type transistor structure is shown. This embodiment utilizes four transistors, 36, 38, 40, and 42. Drains, 44, 46, 48, and 50, of each of the four transistors, 36, 38, 40, and 42, may all be conductively coupled together and conductively coupled to a voltage source (shown as VDD). Gates of two of the transistors, such as gates 52 and 54 of transistors 36 and 38, respectively, may be conductively coupled together and connected to an antenna 60. Additionally, gates of two of the transistors, such as gates 56 and 58 of transistors 40 and 42, respectively, may be conductively coupled together and connected to an antenna 62. As indicated, sources 51, 53, 55, and 57 of transistors 36, 38, 40, and 42 may be conductively coupled together and conductively coupled to a ground reference 59.

Figure 5:
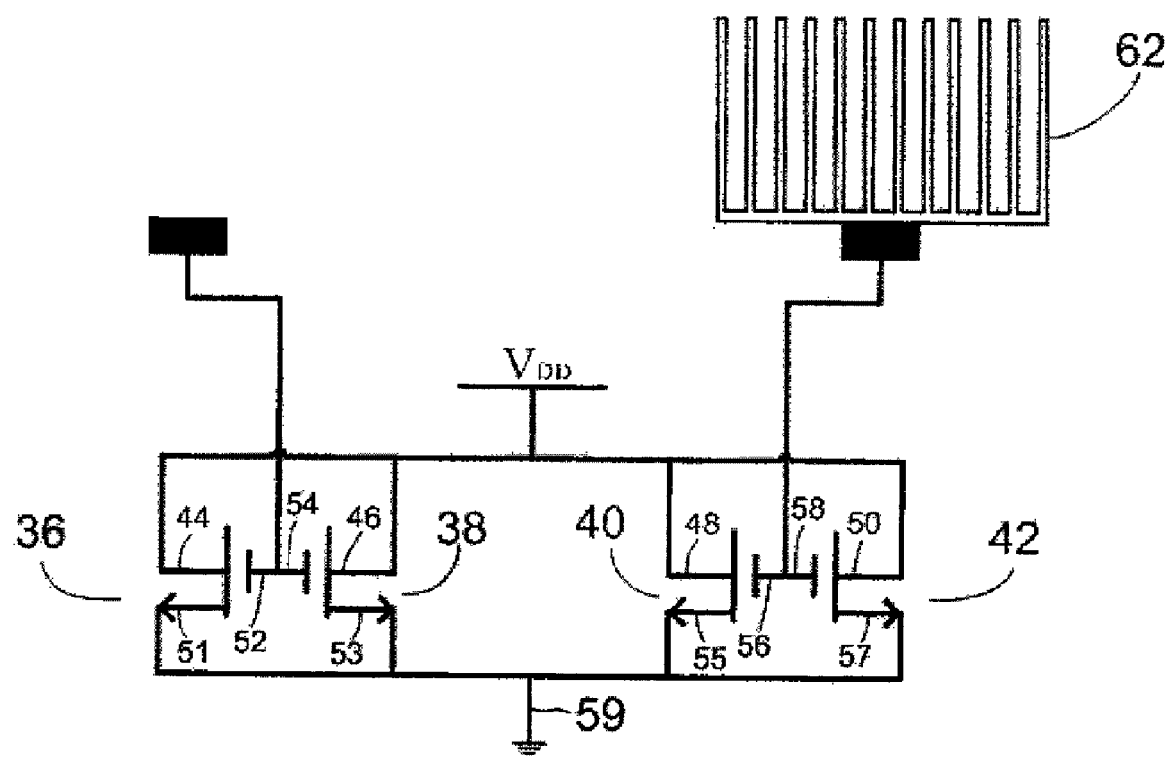
FIG. 5 illustrates a circuit diagram of a plasma induced damage tester with a "cross-couple" type transistor structure and "asymmetric" antenna structure in accordance with an embodiment of the present invention.

With reference now to FIG. 5, a tester 64 with a "cross-couple" type transistor structure is shown. This embodiment utilizes four transistors, 36, 38, 40, and 42. Similar to FIG. 4, the drains 44, 46, 48, and 50 of each of the four transistors, 36, 38, 40, and 42, may all be conductively coupled together and conductively coupled to a voltage source (shown as VDD). In this embodiment an asymmetric antenna structure is utilized to monitor non-balance antenna design. Accordingly, gates of two of the transistors, such as gates 56 and 58 of transistors 40 and 42, respectively, may be conductively coupled together and conductively coupled to antenna 62. In this embodiment, the other gates, such as gates 52 and 54, may not be conductively coupled to an antenna. Sources 51, 53, 55, and 57 of transistors 36, 38, 40, and 42, respectively, may be conductively coupled together and conductively coupled to a ground reference 59.

Figure 6:
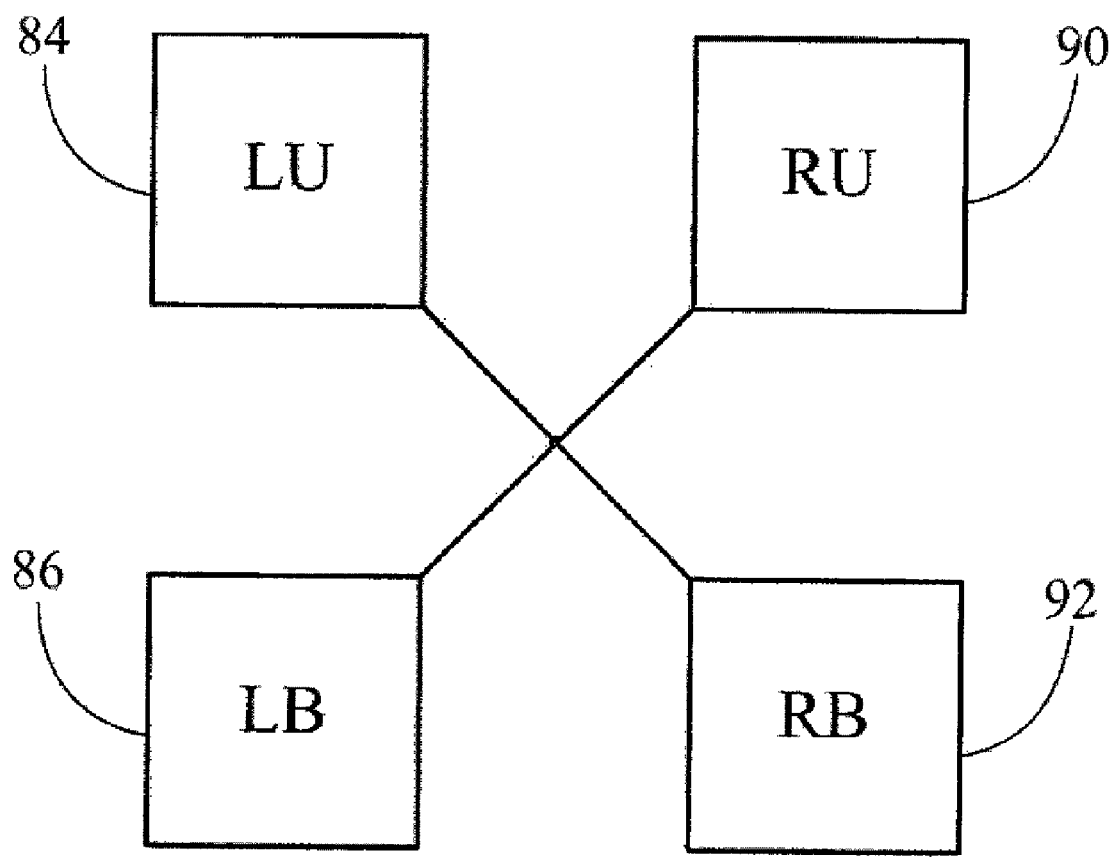
FIG. 6 illustrates a "cross-couple" configuration in accordance with an embodiment of the present invention.

FIG. 6 provides a graphical representation of the transistor cross-couple configuration in accordance with certain embodiments of the invention. As illustrated, a "L" transistor may be indicated by a LU 84 and a LB 86. The "LU" refers to "Left Upper" and the "LB" stands for "Left Bottom." In various embodiments the LU may refer to the drain and LB may refer to the source. As illustrated, a "R" transistor may be indicated by a RU 90 and a RB 92. The "RU" refers to "Right Upper" and the "RB" stands for "Right Bottom." In various embodiments the RU may refer to the drain and RB may refer to the source. As illustrated, in the cross-couple type embodiment, LU 84 may he coupled to RB 92 and LB 86 may be coupled to RU 90.

Figure 7:
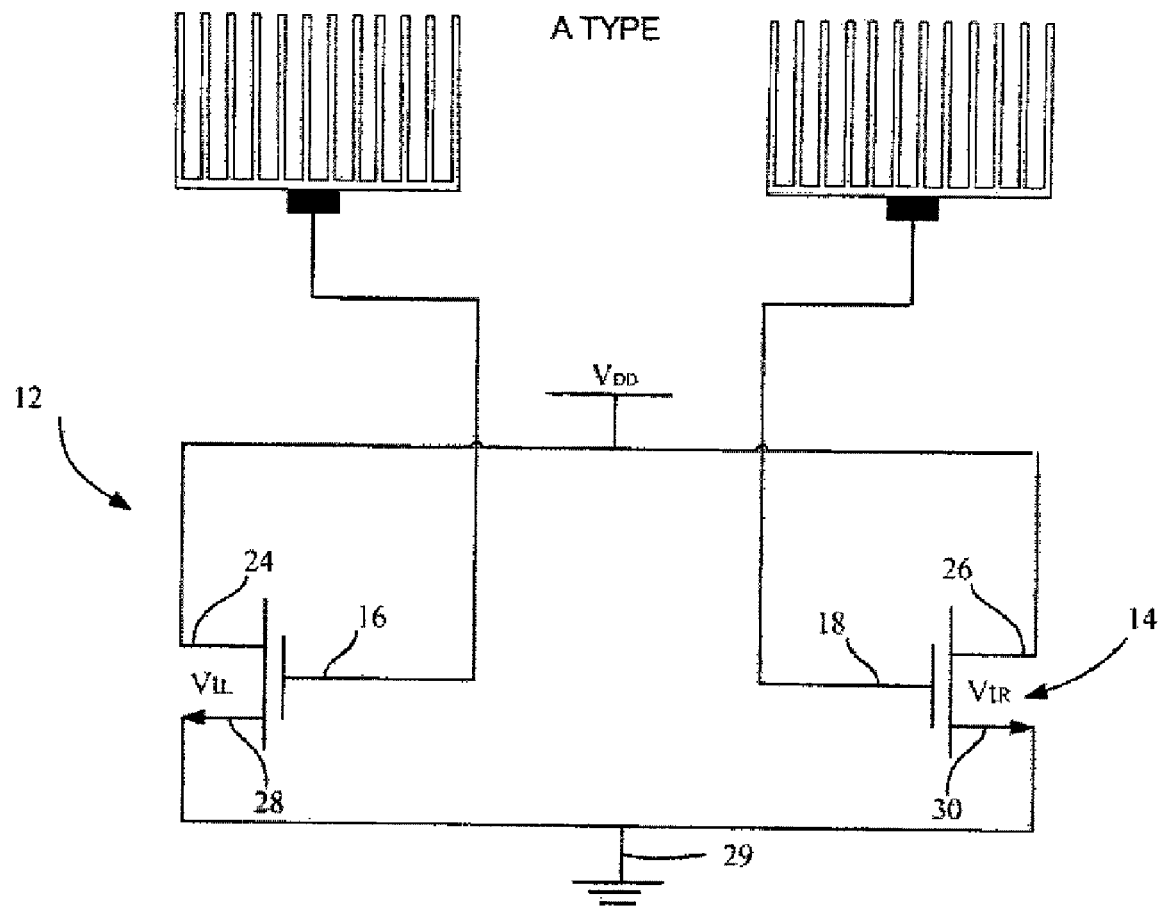
FIG. 7 illustrates a circuit diagram of a plasma induced damage tester with a "parallel" transistor structure and "symmetric" antenna structure in accordance with an embodiment of the present invention.
Figure 8:
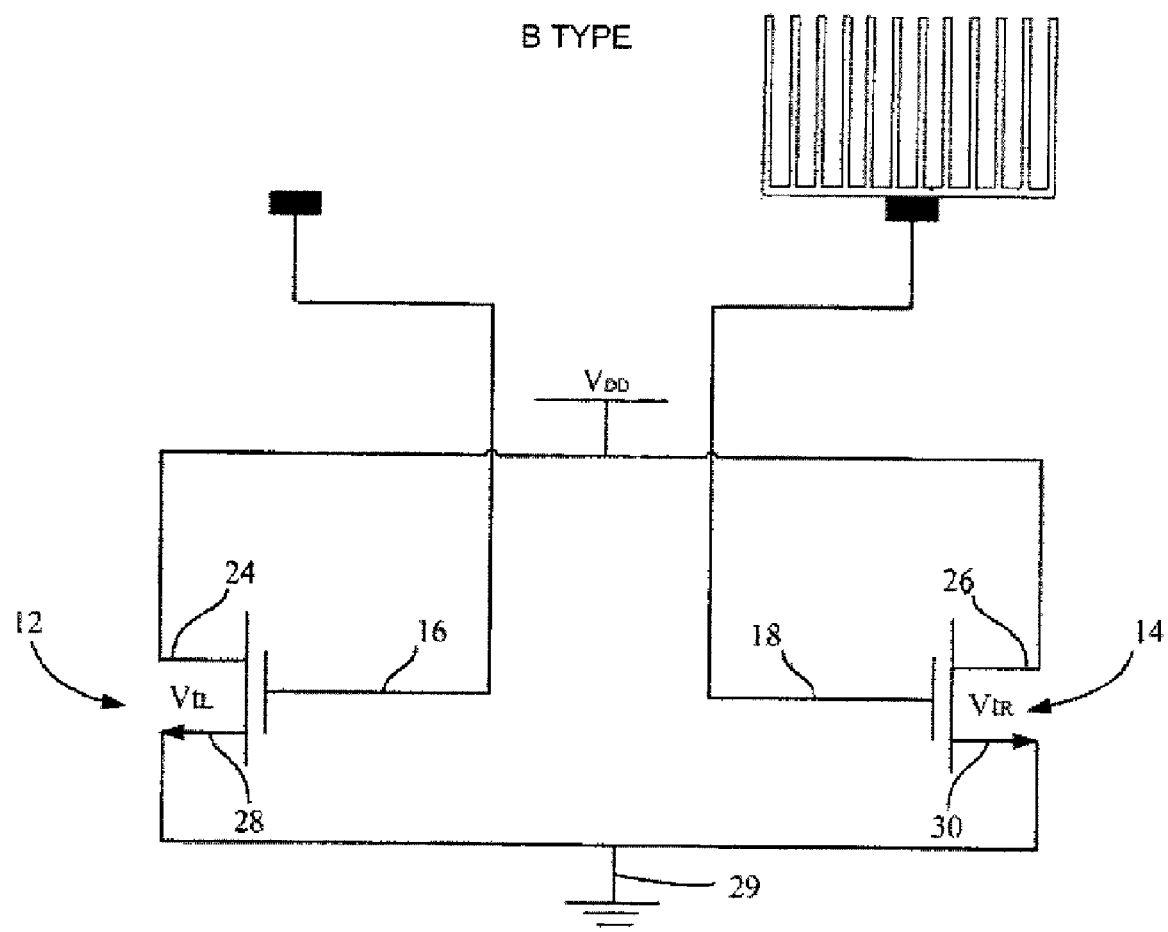
FIG. 8 illustrates a circuit diagram of a plasma induced damage tester with a "parallel" transistor structure and "asymmetric" antenna structure in accordance with an embodiment of the present invention.

Various embodiments of the tester may be utilized to measure electrical and reliability parameters, such as single transistor drift and matching performance degradation. As shown in FIGS. 7 and 8, threshold voltages of transistors 12 and 14 may be measured and analyzed for diagnostic purposes. In FIG. 7, the tester is shown configured with parallel matching structure and a symmetric antenna structure (similar to the embodiment shown in FIG. 2) and the tester in FIG. 8 is configured with a parallel matching structure and an asymmetric antenna structure (similar to the embodiment shown in FIG. 3). In FIGS. 7 and 8, the threshold voltage of transistor 12 is denoted by $Vt_L$ and the threshold voltage of transistor 14 is denoted by $Vt_R$.

Figure 9:
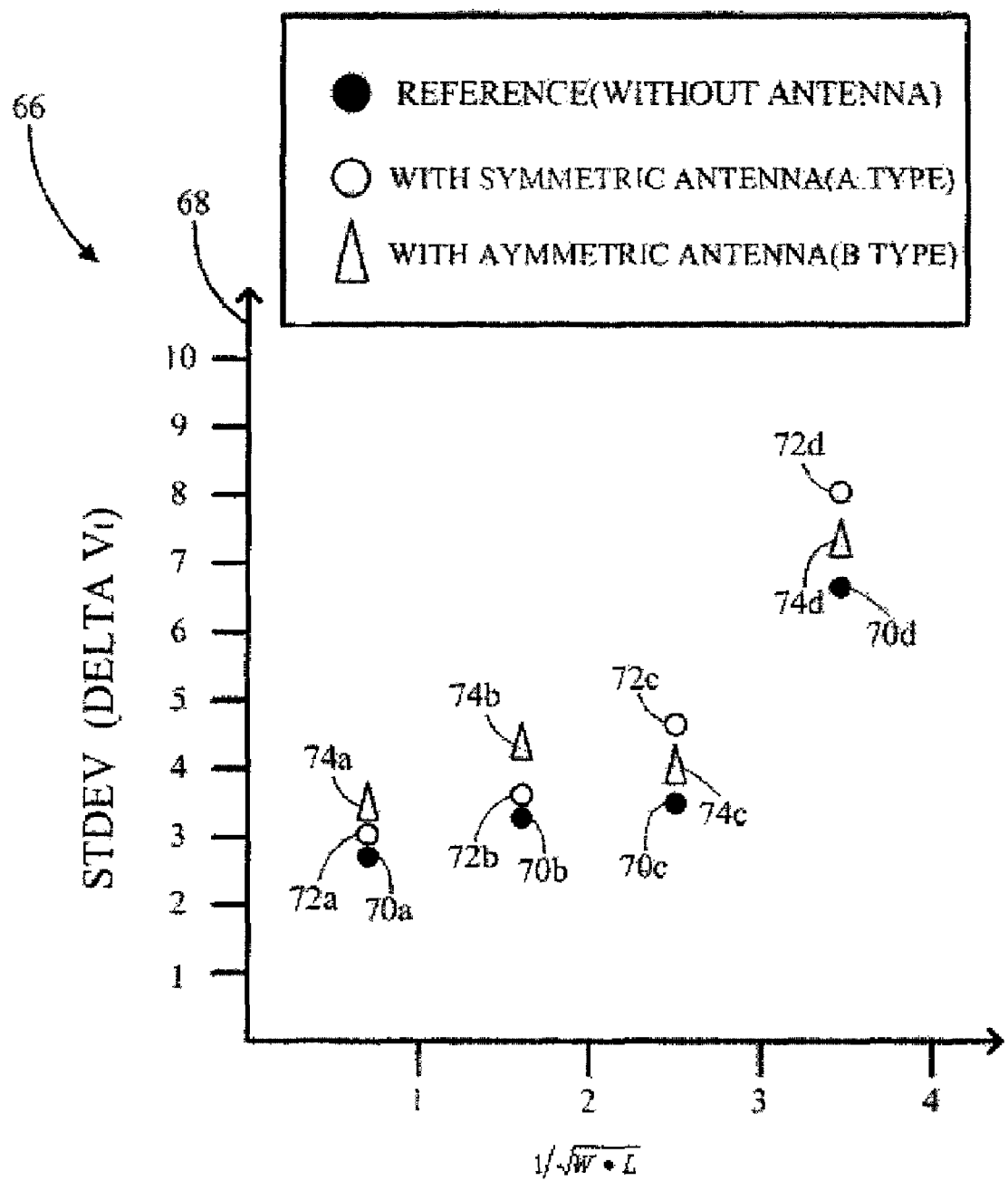
FIG. 9 is a graphical representation of the standard deviation of the threshold voltages in accordance with an embodiment of the present invention.

Graph 66 on FIG. 9 represents matching performance degradation through Vt matching. It is appreciated that the testers can also be used to measure other characteristics, such as single transistor drift. Standard deviation of Delta Vt is shown on vertical axis 68. In this embodiment Delta Vt is equal to $Vt_L$ subtracted from $Vt_R$ as shown in Equation 1:

$$\text{Delta } Vt = Vt_R - Vt_L \quad \text{Equation 1}$$

A reference standard deviation of Delta Vt is denoted on the graph by points 70a, 70b, 70c, and 70d. A standard deviation of Delta Vt using the test structure shown in FIG. 7 is denoted on the graph by points 72a, 72b, 72c, and 72d. A standard deviation of Delta Vt using the test structure shown in FIG. 8 is denoted on the graph by points 74a, 74b, 74c, and 74d. The test structure shown in FIG. 7 uses a symmetric antenna structure with a parallel transistor arrangement. The test structure shown in FIG. 8 uses an asymmetric antenna structure with a parallel transistor arrangement. Delta Vt indicates local plasma uniformity, whereas the standard deviation of Delta Vt provides an indication of global plasma uniformity. As appreciated by those of ordinary skill in the art, the threshold voltages can be measured using any suitable technique, such as using test probes. Additionally, as appreciated by those of ordinary skill in the art, other test structure configurations can be used to characterize and evaluate other parameters.

The embodiments are not to be construed as limited to the particular embodiments disclosed. The embodiments are therefore to be regarded as illustrative rather than restrictive. Variations and changes may be made by others without departing from the scope of the claims. Accordingly, it is expressly intended that all such equivalents, variations and changes that fall within the scope of the claims be embraced thereby.

In summary, numerous benefits have been described which result from employing the concepts described herein. The foregoing description of the one or more embodiments has been presented for purposes of illustration and description. It is not intended to be exhaustive or limiting to the precise form disclosed. Modifications or variations are possible in light of the above teachings. The one or more embodiments were chosen and described in order to illustrate principles and practical application to thereby enable one of ordinary skill in the art to utilize the various embodiments and with various modifications as are suited to the particular use contemplated. It is intended that the claim submitted herewith define the overall scope.

What is claimed is:

1. A plasma damage detection test structure comprising:
   a first antenna;
   a voltage source;
   ground reference;
   a first transistor grouping formed on a silicon wafer, the first transistor grouping comprising a first transistor whose gate is conductively coupled to a gate of a third transistor, wherein the first transistor grouping is conductively coupled to the first antenna,
   a second transistor grouping formed on a silicon wafer, the second transistor gouping comprising a second transistor whose gate is conductively coupled to a gate of a fourth transistor, wherein each source of the first through fourth transistor is conductively coupled to the ground reference.

2. The test structure of claim 1, further comprising:
   a second antenna;
   wherein the second transistor grouping is conductively coupled to the second antenna.

3. The test structure of claim 2, wherein
   the first transistor comprises a first source, a first gate, and a first drain;
   the second transistor comprises a second source, a second gate, and a second drain;
   the third transistor comprises a third source, a third gate, and a third drain; and
   the fourth transistor comprises a fourth source, a fourth gate, and a fourth drain.

4. The test structure of claim 3, wherein
   the first gate is conductively coupled to the third gate and the second gate is conductively coupled to the fourth gate.

5. The test structure of claim 4, wherein
   the first gate and the third gate are conductively coupled to the first antenna.

6. The test structure of claim 5, wherein
   the second gate and the fourth gate are coupled to the second antenna.

7. The test structure of claim 6, wherein the first source, second source, third source, and fourth source are conductively coupled to the ground reference.

8. The test structure of claim 7, wherein the first drain, second drain, third drain, and fourth drain are conductively coupled to the voltage source.

9. A plasma damage detection test structure comprising:
   a first antenna;
   a voltage source;
   a ground reference;
   a first MOS transistor formed on a silicon wafer, the first MOS transistor comprising a first source, a first gate, and a first drain;
   a second MOS transistor formed on a silicon wafer, the second MOS transistor comprising a second source, a second gate, and a second drain, wherein the first drain and the second drain are conductively coupled to the voltage source, and the first source and the second source are conductively coupled to the ground reference;
   a third MOS transistor comprising a third source, a third gate, and a third drain; and
   a fourth transistor MOS comprising a fourth source, a fourth gate, and a fourth drain, wherein the first gate and the third gate are conductively coupled to the first antenna.

10. The test structure of claim 9, further compromising:
    a second antenna;
    wherein the second gate and the fourth gate are conductively coupled to the second antenna.

11. The test structure of claim 9, wherein the third drain and the fourth drain are conductively coupled to the voltage source, and the third source and the fourth source are conductively coupled to the ground reference.

12. A plasma damage evaluation method, the plasma damage evaluation method comprising the steps of:
    forming a test structure on a silicon substrate, the test structure comprised of a first transistor and a second transistor;
    measuring a first threshold voltage of the first transistor;
    measuring a second threshold voltage of a second transistor;
    determining a difference between the first threshold voltage and the second threshold voltage, the difference indicating local plasma uniformity;
    determining the standard deviation of the difference, the stand deviation indicating global plasma uniformity.

13. The method of claim 12, wherein the first gate is conductively coupled to an antenna.

14. The method of claim 13, wherein the test structure further comprises a third transistor and a fourth transistor, the third transistor comprising a third source, a third gate, and third drain, and the fourth transistor comprising a fourth source, a fourth gate, and fourth drain.

15. The method of claim 14, wherein the first transistor comprises a first source, a first gate, and a first drain, and a second transistor comprising a second source, a second gate, and a second drain.

16. The method of claim 15, wherein the first gate is conductively coupled to the antenna.

17. The method of claim 16, wherein the test structure further comprises a second antenna.

18. The method of claim 17, wherein the second gate and the fourth gate are conductively coupled to the second antenna.

19. The method of claim 18, further comprising the steps of:
measuring a third threshold voltage of the first transistor;
measuring a fourth threshold voltage of a second transistor.

* * * * *